United States Patent
Kim et al.

(10) Patent No.: US 8,217,416 B2
(45) Date of Patent: Jul. 10, 2012

(54) LIGHT EMITTING DEVICE PACKAGE AND METHOD FOR FABRICATING THE SAME

(75) Inventors: Geun Ho Kim, Seoul (KR); Yong Seon Song, Seoul (KR); Yu Ho Won, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/740,968

(22) PCT Filed: Nov. 3, 2008

(86) PCT No.: PCT/KR2008/006473
§ 371 (c)(1),
(2), (4) Date: Aug. 3, 2010

(87) PCT Pub. No.: WO2009/057983
PCT Pub. Date: May 7, 2009

(65) Prior Publication Data
US 2010/0295089 A1      Nov. 25, 2010

(30) Foreign Application Priority Data
Nov. 1, 2007   (KR) .......................... 10-2007-0110865

(51) Int. Cl.
*H01L 33/48*       (2010.01)
(52) U.S. Cl. ................ 257/99; 257/81; 257/89; 257/93; 257/98; 257/100; 257/106; 257/603; 257/604; 257/605; 257/606; 257/E33.062; 257/E33.006; 257/E29.335; 257/E25.032; 257/E33.058
(58) Field of Classification Search .................. 257/106, 257/603, 99, E33.058
See application file for complete search history.

(56) References Cited

U.S. PATENT DOCUMENTS

| | | | |
|---|---|---|---|
| 6,472,688 B2 | 10/2002 | Miyata | |
| 7,420,221 B2 | 9/2008 | Nagai | |
| 7,738,764 B2 | 6/2010 | Kim | |
| 8,008,677 B2 | 8/2011 | Kim et al. | |
| 2005/0121686 A1* | 6/2005 | Keller et al. | 257/99 |
| 2005/0230692 A1* | 10/2005 | Kim et al. | 257/79 |
| 2007/0200131 A1* | 8/2007 | Kim | 257/99 |
| 2010/0213498 A1* | 8/2010 | Kim | 257/99 |
| 2011/0012153 A1* | 1/2011 | Kim | 257/98 |

FOREIGN PATENT DOCUMENTS

| | | |
|---|---|---|
| EP | 1826834 A2 | 8/2007 |
| JP | 2-45654 U | 3/1990 |
| JP | 11-214747 A | 8/1999 |
| JP | 11-220167 A | 8/1999 |

(Continued)

*Primary Examiner* — N Drew Richards
*Assistant Examiner* — John P Dulka
(74) *Attorney, Agent, or Firm* — Birch, Stewart, Kolasch & Birch, LLP

(57) ABSTRACT

Provided are a light emitting device package and a method for fabricating the same. The light emitting device package comprises a substrate; a light emitting device on the substrate; a zener diode comprising a first conductive type impurity region and two second conductive type impurity regions, the first conductive type impurity region being disposed in the substrate, the two second conductive type impurity regions being separately disposed in two areas of the first conductive type impurity region; and a first electrode layer and a second electrode layer, each of them being electrically connected to the second conductive type impurity regions and the light emitting device.

6 Claims, 4 Drawing Sheets

FOREIGN PATENT DOCUMENTS

| | | |
|---|---|---|
| JP | 2001-15815 A | 1/2001 |
| JP | 2001-244506 A | 9/2001 |
| JP | 2003-017574 A | 1/2003 |
| JP | 2003-060045 A | 2/2003 |
| JP | 2005-311364 A | 11/2005 |
| JP | 2006-019666 A | 1/2006 |
| JP | 2006-086469 A | 3/2006 |
| JP | 2006-237104 A | 9/2006 |
| JP | 2006237104 A * | 9/2006 |
| JP | 2006-339591 A | 12/2006 |
| JP | 2007-235137 A | 9/2007 |
| KR | 10-0609970 B1 | 7/2006 |
| KR | 100609970 B1 * | 7/2006 |
| KR | 10-2006-0090466 A | 8/2006 |
| KR | 10-0646569 B1 | 11/2006 |
| KR | 10-0746783 B1 | 7/2007 |
| KR | 2008051877 A * | 6/2008 |
| WO | WO 2006/054616 A1 | 5/2006 |
| WO | WO 2006054616 A1 * | 5/2006 |

* cited by examiner

[Fig. 1]
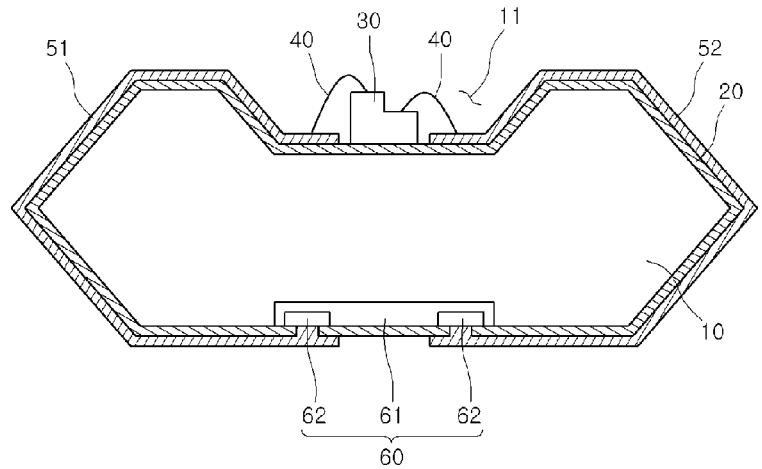
[Fig. 2]
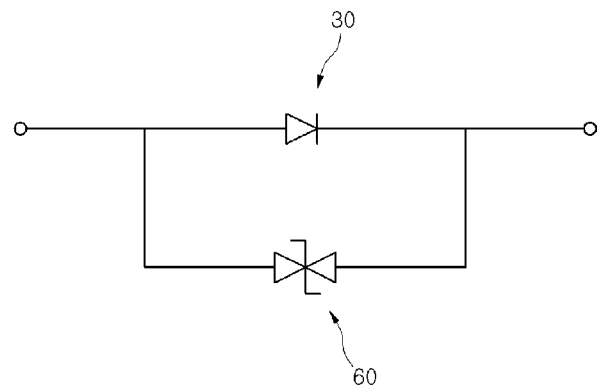
[Fig. 3]
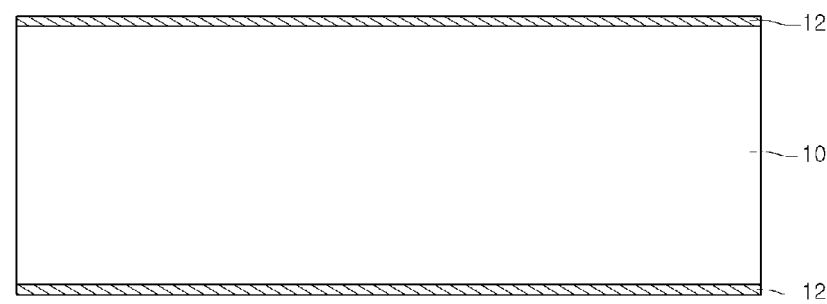
[Fig. 4]
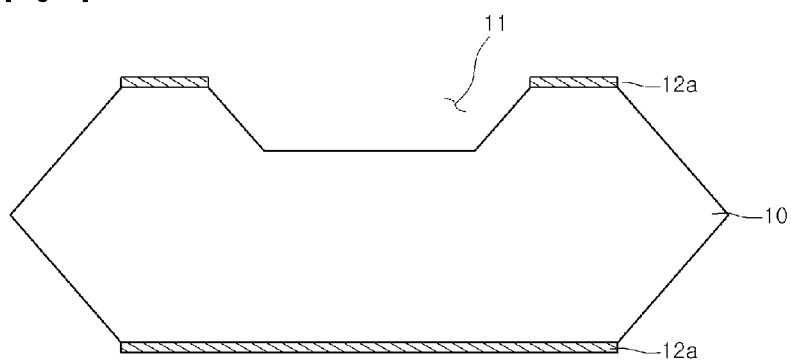

[Fig. 5]
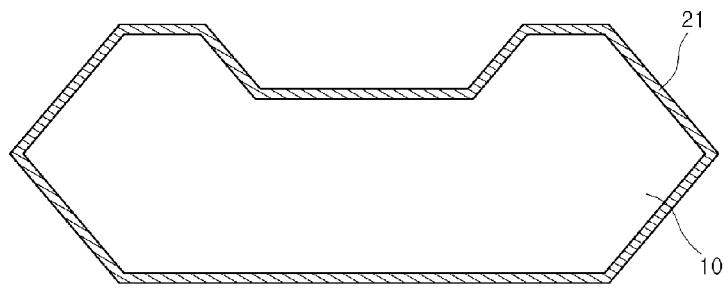
[Fig. 6]
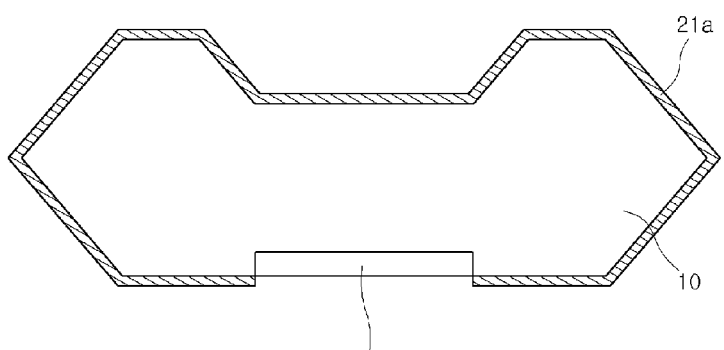
[Fig. 7]
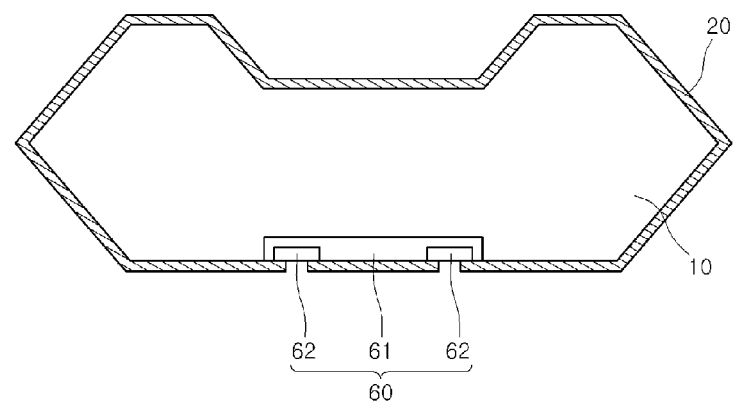
[Fig. 8]
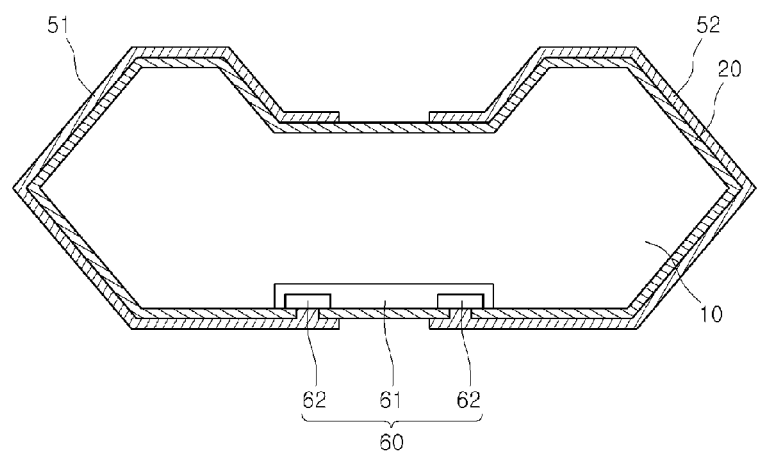

[Fig. 9]
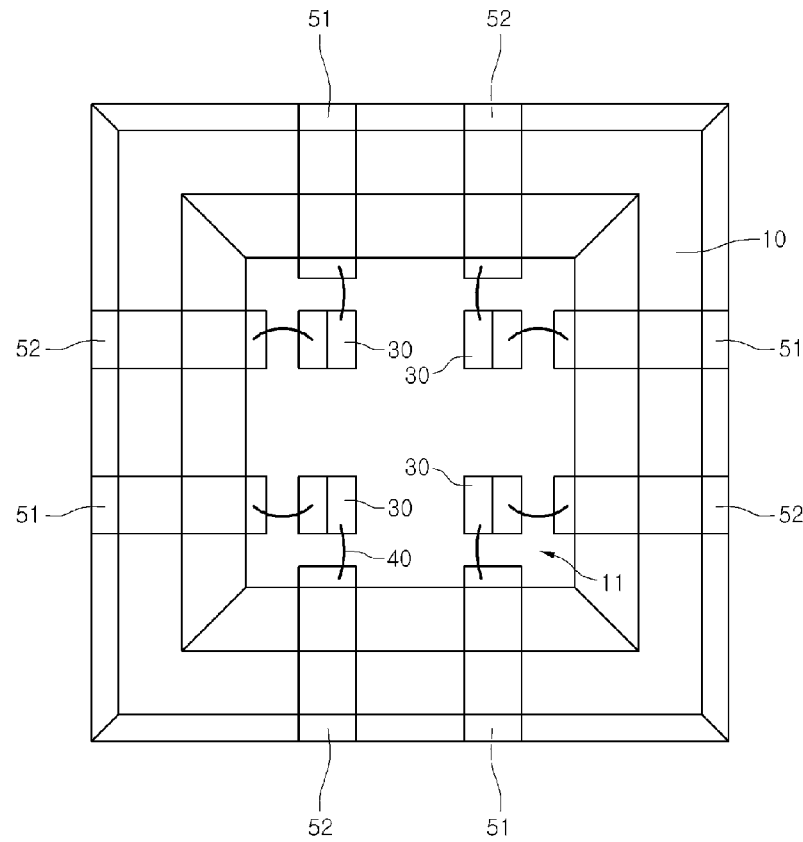
[Fig. 10]
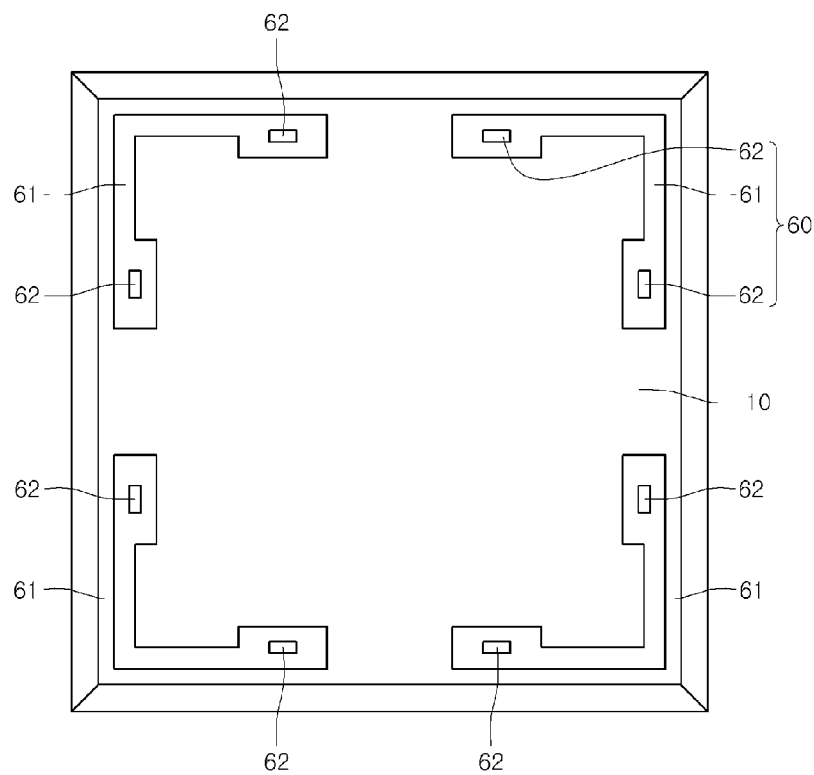

[Fig. 11]
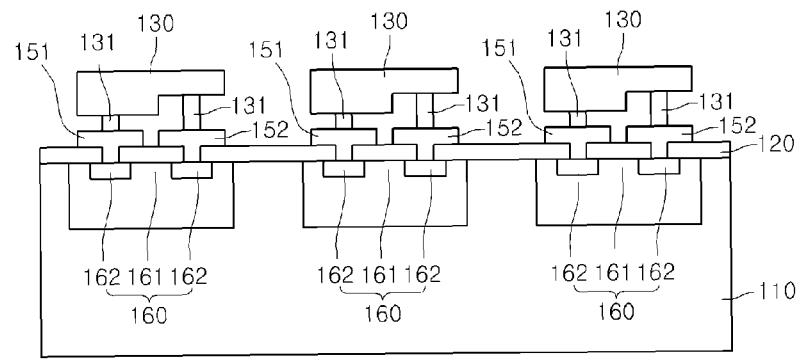
[Fig. 12]
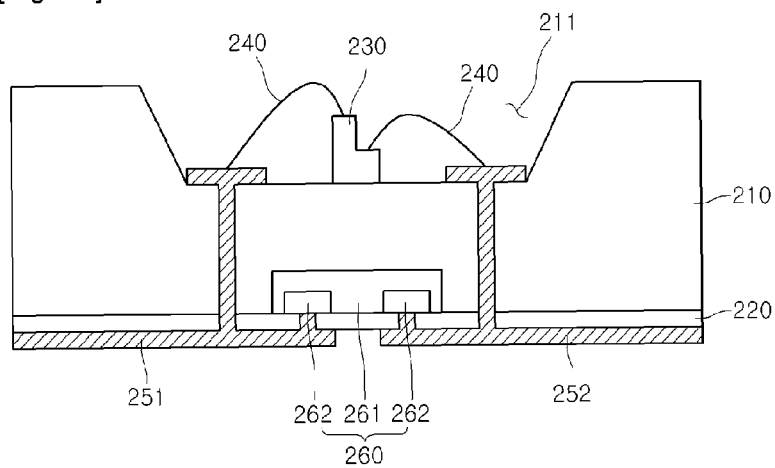
[Fig. 13]
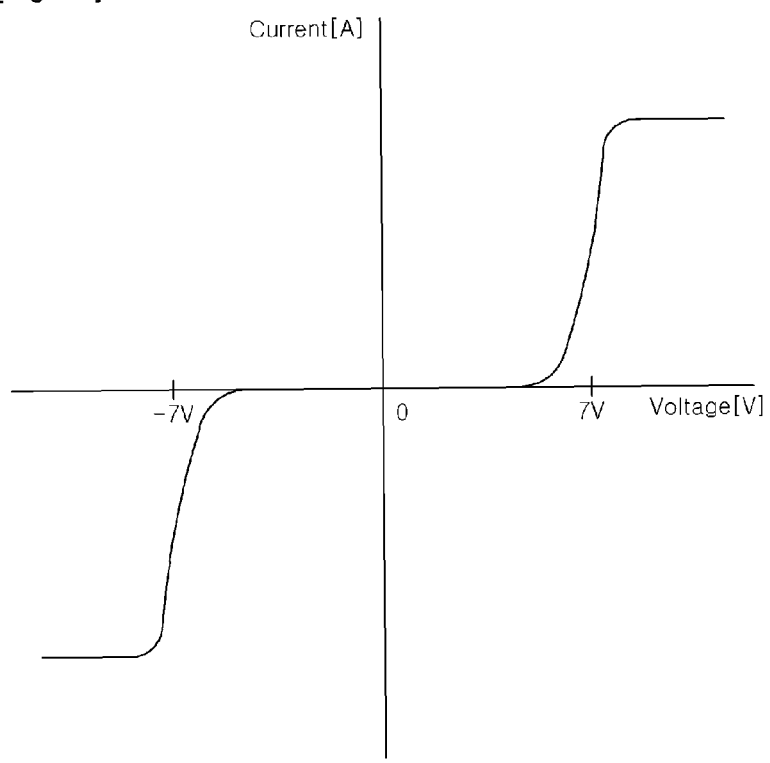

LIGHT EMITTING DEVICE PACKAGE AND METHOD FOR FABRICATING THE SAME

TECHNICAL FIELD

The present invention relates to a light emitting device package and a method for fabricating the same.

BACKGROUND ART

A light emitting diode (LED) is a semiconductor light emitting device that converts electric current into light.

The wavelength of light emitted from the light emitting diode is determined depending on a semiconductor material used to manufacture the light emitting diode. This is because the wavelength of the emitted light corresponds to a band gap of the semiconductor material, which is defined as an energy difference between electrons in the valence band and electrons in the conduction band.

Recently, in line with an increase in brightness of the LED, the LED is used as light sources for display apparatuses, vehicles and illumination apparatuses. Upon a combination of LEDs having a variety of colors or a use of phosphors, an LED emitting white light can be realized with excellent luminous efficiency.

DISCLOSURE OF INVENTION

Technical Problem

Embodiments provide a light emitting device package having a new structure and a method for fabricating the same.

Embodiments provide a light emitting device package with an improved electrical stability and a method for fabricating the same.

Technical Solution

In an embodiment, A light emitting device package comprises a substrate; a light emitting device on the substrate; a zener diode comprising a first conductive type impurity region and two second conductive type impurity regions, the first conductive type impurity region being disposed in the substrate, the two second conductive type impurity regions being separately disposed in two areas of the first conductive type impurity region; and a first electrode layer and a second electrode layer, each of them being electrically connected to the second conductive type impurity regions and the light emitting device.

In an embodiment, A light emitting device package comprises a substrate; a light emitting device on the substrate; a zener diode comprising a first conductive type impurity region and two second conductive type impurity regions in the substrate, the two second conductive type impurity regions being separately disposed in two areas; a first electrode layer and a second electrode layer, each of them being electrically connected to the second conductive type impurity regions and the light emitting device; and an insulating layer between the substrate and at least one of the electrode layers.

In an embodiment, A method for fabricating a light emitting device package comprises forming a zener diode comprising forming a first conductive type impurity region in a substrate and forming two second conductive type impurity regions disposed separately in two areas of the first conductive type impurity region; installing a light emitting device on the substrate; and forming a first electrode layer and a second electrode layer, each of them being electrically connected to the light emitting device and the zener diode.

Advantageous Effects

Embodiments can provide a light emitting device package having a new structure and a method for fabricating the same.

Embodiments can provide a light emitting device package with an improved electrical stability and a method for fabricating the same.

BRIEF DESCRIPTION OF THE DRAWINGS

FIG. 1 is a cross-sectional view illustrating a light emitting device package according to a first embodiment.

FIG. 2 is an equivalent circuit view illustrating the light emitting device package according to the first embodiment.

FIGS. 3 to 8 are cross-sectional views illustrating a method for fabricating the light emitting device package according to the first embodiment.

FIG. 9 is a plan view illustrating a plurality of light emitting devices in a substrate in the light emitting device package according to the first embodiment.

FIG. 10 is a rear view illustrating a plurality of zener diodes at the bottom of the substrate of FIG. 9.

FIG. 11 is a cross-sectional view illustrating a light emitting device package according to a second embodiment.

FIG. 12 is a cross-sectional view illustrating a light emitting device package according to a third embodiment.

FIG. 13 is a graph illustrating a voltage-current characteristic of the zener diode in a light emitting device package according to an embodiment.

MODE FOR THE INVENTION

Hereinafter, a light emitting device package and a method for fabricating the same according to an embodiment of the present invention will now be described with reference to the accompanying drawings.

It will be apparent to those skilled in the art that various modifications and variations can be made in the present invention without departing form the spirit or scope of the invention. Thus, it is intended that the present invention covers the modifications and variations of this invention provided they come within the scope of the appended claims and their equivalents.

Like reference numerals in the drawings denote like elements, and thus their description will be omitted. In the drawings, the thicknesses of layers and regions are exaggerated for clarity.

In the following description, it will be understood that when a layer (or film) is referred to as being "on" or "under" another layer or substrate, it can be directly "on" or "under" the other layer or substrate, or intervening layers may also be present. Further, it will be understood that when a constituent element such as surface is referred to as 'inner', this means that the surface is farther from an outer side of the device than other constituent elements.

It will be further understood that orientations of constituent elements in the drawings are not limited thereto. In addition, when the word 'directly' is referred, it means that no intervening constituent element is present. The word 'and/or' means that one or more or a combination of relevant constituent elements is possible.

FIG. 1 is a cross-sectional view illustrating a light emitting device package according to a first embodiment and FIG. 2 is an equivalent circuit view illustrating the light emitting device package according to the first embodiment.

In a light emitting device package according to an embodiment, referring to FIG. 1, a cavity 11 is formed in a substrate 10 and an insulating layer 20 is formed on the surface of the substrate 10.

A light emitting device 30 is installed in the cavity 11 of the substrate 10 and electrically connected to a first electrode layer 51 and a second electrode layer 52 through wires 40.

A first conductive type impurity region 61 is disposed at the bottom of the substrate 10 and two second conductive type impurity regions 62 are spaced apart from each other in the first conductive type impurity region 61. The second conductive impurity type regions 62 are electrically connected to the first electrode layer 51 and the second electrode layer 52, respectively.

The first conductive type impurity region 61 and the second conductive type impurity regions 62 form a zener diode 60.

Therefore, as illustrated in FIG. 2, the light emitting device 30 and the zener diode 60 are connected together in parallel.

In more detail, the substrate 10 may be a silicon wafer, and the cavity 11 in the substrate 10 may be formed by etching the silicon wafer through a wet or dry etch method.

The insulating layer 20 may be a silicon oxide layer that is formed through an oxidation of the silicon wafer. The insulating layer 20 allows the substrate 10, the first electrode layer 51 and/or the second electrode layer 52 to be electrically separated from each other.

The light emitting device 30 may be a light emitting diode (LED). In FIG. 1, a lateral type LED is illustrated as an example, but a vertical type LED may also be used.

In addition, in FIG. 1, the light emitting device 30 is electrically connected to the first and second electrode layers 51 and 52 through the wires 40. But it is also possible that a light emitting device electrically contacts directly with the electrode layers, or is electrically connected to the first and second electrode layers 51 and 52 through a bump according to LED types.

The first electrode layer 51 and the second electrode layer 52 may be formed of a metal layer. That is, they may be formed of at least one of metals having high reflectivity such as Al, Ag, or Au. Or, they may be formed by coating at least one of Al, Ag and Au on the surface of a metal layer including at least one of Cu, Ti, Cr, or Ni.

Since the first electrode layer 51 and the second electrode layer 52 extend from the top surface to the bottom surface of the substrate 10, power supply may be provided to the light emitting device 30 through the first and second electrode layers 51 and 52, when a light emitting device package according to an embodiment is mounted on a circuit substrate where a circuit pattern formed.

The zener diode 60 is formed by implanting an impurity into the substrate 10. Also, the zener diode 60 may be disposed at the top, bottom or side of the substrate 10.

In the embodiment, the zener diode 60 is disposed at the bottom of the substrate 10. The zener diode 60 may be disposed in a region facing the light emitting device 30 in the substrate 10. That is, the zener diode 60 and the light emitting device 30 may overlap in a vertical direction.

A breakdown voltage of the zener diode 60 is designed to be higher than a voltage applied to the light emitting device 30 and lower than a withstanding voltage of the light emitting device 30.

Accordingly, when overvoltage is applied to the first electrode layer 51 and the second electrode layer 52, current flows through the zener diode 60 so that the zener diode 60 protect the light emitting device 30 against the overvoltage.

The first conductive type impurity region 61 may be formed by an implantation of a p-type impurity and the second conductive type impurity regions 62 may be formed by an implantation of n-type impurities. At this point, the n-type impurity may be implanted into the substrate 10.

In contrast, the first conductive type impurity region 61 may be formed by an implantation of an n-type impurity and the second conductive type impurity regions 62 may be formed by an implantation of p-type impurities. At this point, the p-type impurity may be implanted into the substrate 10.

FIG. 13 is a graph illustrating a voltage-current characteristic of the zener diode in a light emitting device package according to an embodiment.

As illustrated in FIG. 13, when a uniform voltage, e.g. a voltage of about +7 V or about −7 V is applied, a breakdown occurs in the zener diode 60 resulting in a steep increase in current. Consequently, a damage of the light emitting device 30 due to the overvoltage may be prevented.

At this point, implantation concentrations of the n-type and p-type impurities may depend on the designed breakdown voltage of the zener diode 60.

FIGS. 3 to 8 are cross-sectional views illustrating a method for fabricating the light emitting device package according to the first embodiment.

Referring to FIGS. 3 and 4, a first mask layer 12 is formed on the substrate 10 and selectively removed in order to form a first mask pattern 12a. Next, the substrate 10 is etched using the first mask pattern 12a as a mask through a wet or dry etch method. Thus, a cavity 11 is formed.

At this point, for the substrate 10 may be used a silicon wafer containing a second conductive type impurity, and the first mask layer 12 may be formed of silicon nitride or silicon oxide.

Referring to FIGS. 5 and 6, after the first mask pattern 12a is removed, a second mask layer 21 is formed on the surface of the substrate 10. Then, the second mask layer 21 is selectively removed to expose the bottom of the substrate 10, thereby forming a second mask pattern 21a.

At this point, the second mask layer 21 may be a silicon nitride layer or a silicon oxide layer.

Thereafter, a first conductive type impurity region 61 is formed at the bottom of the substrate 10 by using the second mask pattern 21a as a mask.

Referring to FIG. 7, the second mask pattern 21a is removed and an insulating layer 20 is formed on the surface of the substrate 10. Then, the insulating layer 20 disposed on the first conductive type impurity region 61 is selectively removed to expose the first conductive type impurity region 61 in two areas.

After that, second conductive type impurities are implanted into the exposed areas of the first conductive type impurity region 61, thereby forming second conductive type impurity regions 62.

The first conductive type impurity region 61 and the second conductive type impurity regions 62 form the zener diode 60.

Referring to FIG. 8, a metal layer is formed on the insulating layer 20 and the substrate 10 and then selectively removed to form first and second electrode layers 51 and 52.

The first and second electrode layers 51 and 52 are spaced apart from each other and electrically connected to the second conductive type regions 62 respectively, extending toward the cavity 11 along the sides of the substrate 10.

Thereafter, the light emitting device 30 is disposed in the cavity 11 and electrically connected to the first and second electrode layers 51 and 52 through the wires 40.

Consequently, a light emitting device package as illustrated in FIG. 1 is fabricated.

In the light emitting device package according to an embodiment, the zener diode 60 is formed while the first conductive type impurity region 61 has a well structure and the second conductive type impurity regions 62 are disposed in the well structure.

Therefore, when a plurality of the light emitting devices 30 are installed in the light emitting device package and accordingly, a plurality of the zener diodes 60 are formed, cross talk between adjacent zener diodes can be prevented.

FIGS. 9 and 10 are views illustrating a plurality of the light emitting devices in the light emitting device package according to the first embodiment.

FIG. 9 is a plan view illustrating a plurality of light emitting devices in a substrate and FIG. 10 is a rear view illustrating a plurality of zener diodes at the bottom of the substrate.

Referring to FIGS. 9 and 10, the cavity 11 is formed in the substrate 10 and a plurality of light emitting devices 30 are disposed in the cavity 11. In the embodiment, four light emitting devices 30 are disposed as an example and the insulating layer 20 shown in FIG. 1 is omitted in FIG. 9 and FIG. 10.

Thereafter, the first electrode layers 51 and the second electrode layers 52 corresponding to the light emitting devices 30 are formed on the substrate 10. Additionally, the first and second electrode layers 51 and 52 are electrically connected to the light emitting devices 30 through the wires 40.

At the bottom of the substrate 10 are formed a plurality of zener diodes 60 corresponding to the number of light emitting devices 30. In the embodiment, four zener diodes 60 are formed as an example and the insulating layer 20 and the first and second electrode layers 51 and 52 shown in FIG. 1 are omitted in FIG. 9 and FIG. 10.

The first and second electrode layers 51 and 52 are electrically connected to the second conductive type impurity regions 62 in the first conductive type impurity regions 61, respectively. The second conductive type impurity regions 62 may be disposed close to the two adjacent sides of the substrate 10 and the first conductive type impurity region 61 may be formed along the sides of the substrate 10.

FIG. 11 is a cross-sectional view illustrating a light emitting device package according to a second embodiment.

In the description of the second embodiment, an overlapping description with the first embodiment will be omitted.

Referring to FIG. 11, a plurality of first conductive type impurity regions 161 are formed at the top of a substrate 110 and second conductive type impurity regions 162 are respectively formed in the first conductive type impurity regions 161.

The second conductive type impurity regions 162 are spaced apart from each other in two areas of the first conductive type impurity region 161, and the second conductive type impurity regions 162 and the first conductive type impurity regions 161 form zener diodes 160.

An insulating layer 120 is formed on the top surface of the substrate 110 and selectively removed to form first electrode layers 151 and second electrode layer 152. The first and the second electrode layers 151 and 152 on the insulating layer 120 are electrically connected to the second conductive type impurity regions 162, respectively.

Next, light emitting devices are installed on the first and second electrode layers 151 and 152. The light emitting devices 130 are electrically connected to the first and second electrode layers 151 and 152 through bumps 131.

The light emitting devices 130 may be light emitting diodes emitting red, green and blue light respectively.

The zener diodes 160 including the first conductive type impurity regions 161 and the second conductive type impurity regions 162 are connected in parallel to the light emitting devices 130.

Accordingly, when overvoltage is applied to the light emitting devices 130, current flows through the zener diodes 160 so that the light emitting devices 130 can be protected from the overvoltage.

FIG. 12 is a cross-sectional view illustrating a light emitting device package according to a third embodiment.

In the description of the third embodiment, an overlapping description with the first embodiment will be omitted.

Referring to FIG. 12, a cavity 211 is formed in a substrate 210 and a light emitting device 230 is installed in the cavity 211. After that, a first conductive type impurity region 261 is formed at the bottom of the substrate 210 and second conductive type impurity regions 262 are formed in two separated areas of the first conductive type impurity region 261.

The first conductive type impurity region 261 and the second conductive type impurity regions 262 form a zener diode 260.

An insulating layer 220 is formed on the bottom surface of the substrate 210 and selectively removed to form a first electrode layer 251 and a second electrode layer 252. The first and the second electrode layers 251 and 252 on the insulating layer 220 are electrically connected to the second conductive type impurity regions 262, respectively.

The first and second electrode layers 251 and 252 extend to the top surface of the substrate 210 and pass through the substrate 210. Therefore, the first and second electrode layers 251 and 252 are electrically connected to the light emitting device 230 in the cavity 211 through wires 240.

The zener diode 260 including the first conductive type impurity region 261 and the second conductive type impurity regions 262 are connected in parallel to the light emitting device 230.

Accordingly, when overvoltage is applied to the light emitting device 230, current flows through the zener diode 260 so that the light emitting device 230 can be protected against the overvoltage.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The light emitting device package according to embodiments of the present invention can be used as light sources for illumination apparatuses and a variety of electrical appliances.

The invention claimed is:
1. A light emitting device package comprising:
a package body having a well portion at a bottom surface thereof;
a first conductive region formed in the well portion of the package body, the first conductive region having a well portion at a bottom surface thereof;

a second conductive region formed in the well portion of the first conductive region, and having a conductivity opposite to a conductivity of the first conductive region;

at least one pair of electrodes formed in the package body and electrically connected to the first conductive region or the second conductive region; and a light emitting device installed in the package body and connected to the first and second conductive regions in parallel, wherein the at least one pair of electrodes includes:
   a front electrode placed on a front surface of the package body; and
   a rear electrode connected to the front electrode and placed on a rear surface of the package body, wherein the front electrode is directly connected to the rear electrode through a hole, wherein the package body includes a conductive semiconductor, and wherein the first conductive region has a conductivity opposite to a conductivity of the package body.

2. The light emitting device package of claim 1, wherein the second conductive region has a size smaller than a size of the first conductive region.

3. The light emitting device package of claim 1, wherein a plurality of light emitting devices are provided.

4. The light emitting device package of claim 3, wherein the first and second conductive regions are provided at least as many as the light emitting devices.

5. The light emitting device package of claim 3, wherein each light emitting device is connected to two second conductive regions placed in one first conductive region.

6. The light emitting device package of claim 1, wherein the package body is provided therein with a groove in which the light emitting device is installed.

* * * * *